(12) United States Patent
Chou

(10) Patent No.: US 6,236,598 B1
(45) Date of Patent: May 22, 2001

(54) CLAMPING CIRCUIT FOR CELL PLATE IN DRAM

(75) Inventor: Yung-Fa Chou, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/372,076

(22) Filed: Aug. 11, 1999

(51) Int. Cl.[7] .................................................. G11C 16/04
(52) U.S. Cl. .................................. 365/189.06; 365/189.09
(58) Field of Search ........................ 365/189.06, 189.09, 365/149

(56) References Cited

U.S. PATENT DOCUMENTS

| | | | |
|---|---|---|---|
| 4,769,784 | * 9/1988 | Doluca et al. ........................ | 365/149 |
| 5,255,232 | 10/1993 | Foss et al. ............................ | 365/203 |
| 5,508,962 | * 4/1996 | McLaughlin et al. .......... | 365/189.09 |
| 5,734,603 | 3/1998 | Tai ....................................... | 365/149 |

* cited by examiner

Primary Examiner—Trong Phan
(74) Attorney, Agent, or Firm—George O. Saile; Stephen B. Ackerman; Billy Knowles

(57) ABSTRACT

A voltage clamping circuit prevents fluctuation in a cell plate biasing reference voltage applied to the commonly connected plates of cell capacitors of an array of memory storage cells of a DRAM. The voltage clamping circuit has a clamp signal terminal for receiving a clamping signal that enables the voltage clamping circuit The voltage clamping circuit further has a clamping circuit for providing additional current to the common plates of the cell capacitors of the DRAM array to maintain the plate bias voltage level at the common plates of the cell plate capacitor of the cell. The clamping circuit is has a first current sourcing circuit that is connected the plate bias voltage source for providing the additional current to the plate bias voltage source while maintaining plate bias voltage level when the voltage clamping circuit is enabled. Further, the clamping circuit has a second current sourcing circuit that is plate bias voltage source for providing the additional current to the plate bias voltage source, while maintaining the plate bias voltage level The first current sourcing circuit provides the additional current in a first or positive direction and the second current sourcing circuit provides the additional current in a second or negative direction.

20 Claims, 6 Drawing Sheets

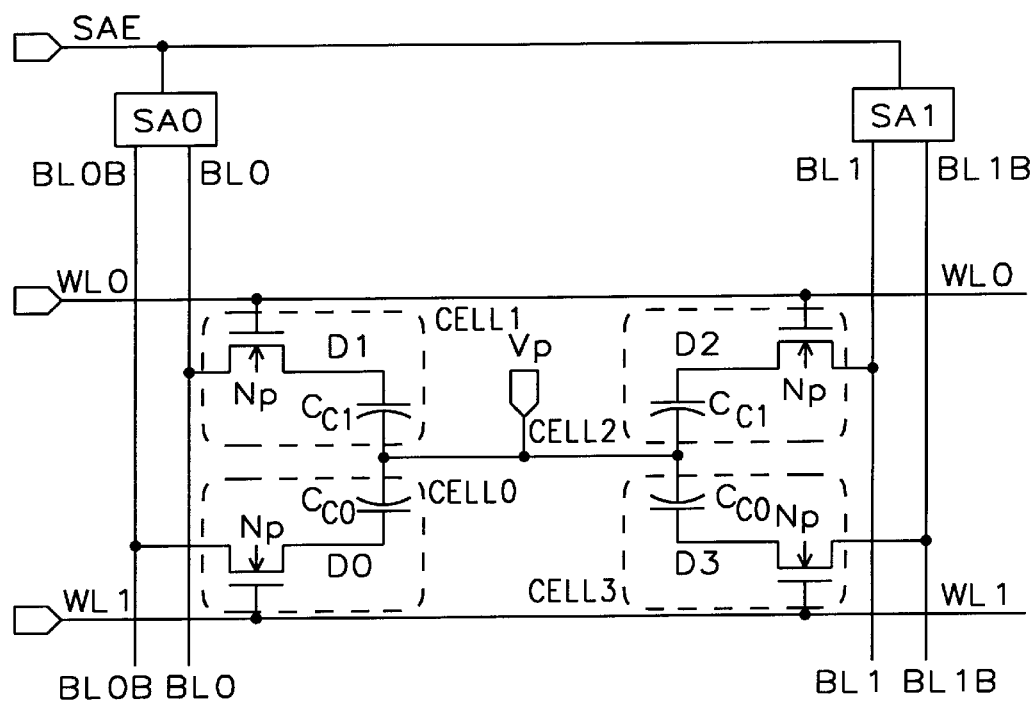
FIG. 1 - Prior Art
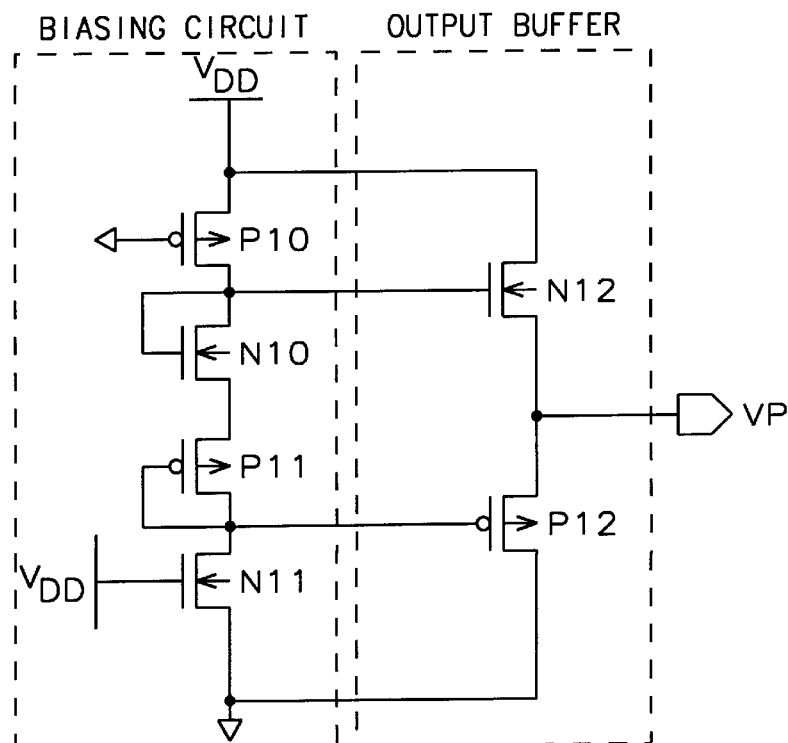
FIG. 2 - Prior Art

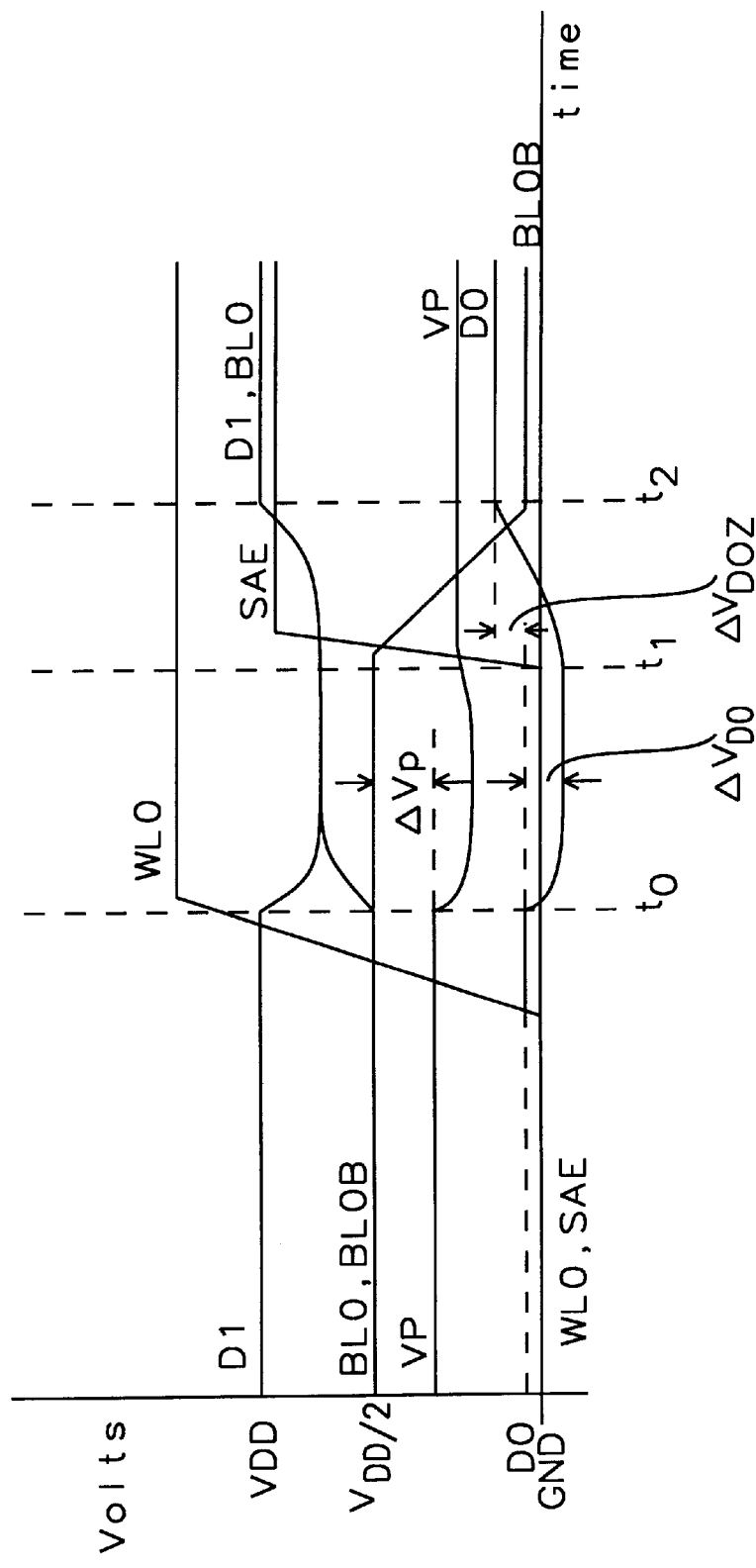
FIG. 3 – Prior Art

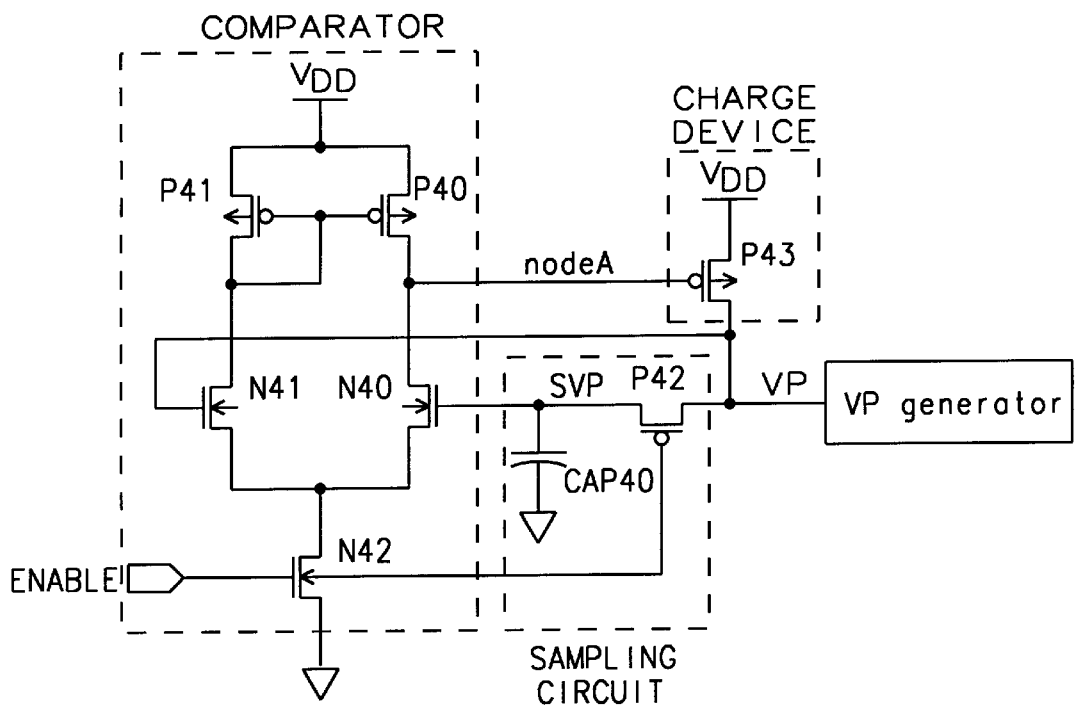
FIG. 4 – Prior Art
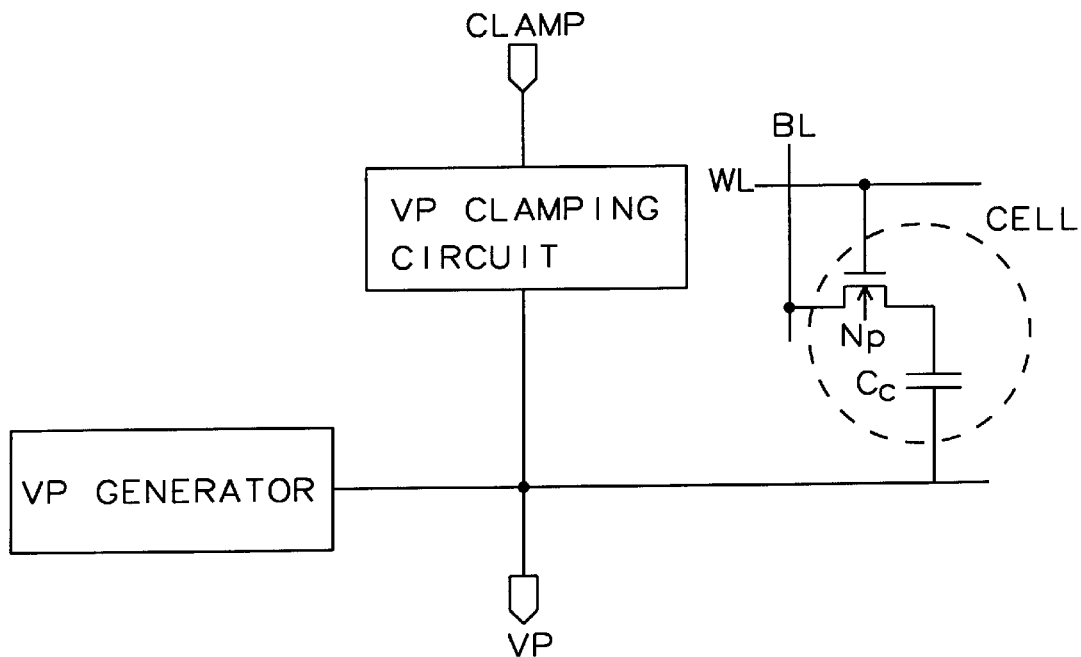
FIG. 5

CLAMPING CIRCUIT FOR CELL PLATE IN DRAM

BACKGROUND OF THE INVENTION

1. Field of the Invention

This invention relates in general to electronic circuits integrated on a semiconductor substrate. More particularly, this invention relates to circuits used to create reference biasing voltages for a common plate of a cell capacitor of a memory storage cell of a dynamic random access memory.

2. Description of the Related Art

FIG. 1 illustrates the general structure of an array of memory storage cells CELL 0, CELL 1, CELL 2, and CELL 3 of a dynamic random access memory (DRAM). Each cell CELL 0, CELL 1, CELL 2, and CELL 3 is formed of a single metal oxide semiconductor (MOS) transistor $N_P$ and a cell capacitor $C_C$. The drain of the pass transistor $N_P$ is connected to a top plate of the cell capacitor $C_C$. The source of the pass transistor $N_P$ is connected to one of the bit-lines BL0, BL0B, BL1, BL1B. The gate of the pass transistor $N_P$ is connected to one of the word-lines WL0 and WL1. The commonly connected plates of all the cell capacitors $C_C$ is connected to a cell plate biasing voltage source $V_P$. The voltage level of the cell plate biasing voltage source $V_P$ is designed to be an intermediate value between the voltage level of the power supply voltage source $V_{DD}$ and the ground reference point GND. The voltage level of the plate biasing voltage source $V_P$ is set such that the voltage developed across the cell capacitors is reduced.

When a cell is to have a bit of digital data written to or retrieved from a cell, one of the word-lines WL0 or WL1 is brought to a voltage level greater than the threshold voltage $V_{TH}$ of the pass transistor $N_P$ plus the voltage level present on either the drain or source of the pass transistor. The bit-lines BL0, BL0B, BL1, BL1B are pre-charged to a voltage level that is one half the value of the voltage level of the power supply voltage source $V_{DD}$, if the memory cell is to have the bit of digital data retrieved from it. If the memory cell contains a high logic level (1), the voltage level of the top plate of the cell capacitor is approximately the voltage level of the power supply voltage source $V_{DD}$. Conversely, if the memory cells contains a low logic level (0), the voltage level at the plate of the cell capacitor is approximately the voltage level of the ground reference point GND. When the pass transistor is activated, a charge flows to or flows from the top plate of the cell capacitor $C_C$. The sense amplifier SA0 or SA1 senses and amplifies this charge flow and forces the bit-lines BL0, BL0B, BL1, BL1B to the appropriate voltage level ($V_{DD}$ or GND) dependent on the logic level stored at the top plate of the cell capacitance.

For writing a bit of digital data to the memory cell, the bit-lines BL0, BL0B, BL1, BL1B are pre-charged appropriately to the voltage level of the desired logic level ($V_{DD}$ or GND).

The appropriate word-line WL0 or WL1 is activated to turn on the pass transistor $N_P$. The voltage present on the appropriate bit-line BL1, BL1B, BL2, or BL2B flows to charge or discharge the cell capacitor.

Refer now to FIG. 2 for a discussion of a typical cell plate reference voltage generator of the prior art. The cell plate reference voltage generator includes a biasing circuit composed of MOS transistors N10, P10, N11 and P11 and an output buffer circuit composed of MOS transistors N12 and P12. The biasing circuit is designed to provide adequate bias to the output circuit such that the cell plate reference voltage generator provides a desired cell plate reference voltage $V_P$. In the circuit as shown, the ratio of the sizes of MOS transistors P10 and N11 is used to determine the right level of the cell plate reference voltage $V_P$ while the ratio of the sizes of MOS transistor N10 and P11 relative to those of MOS transistors P12 and N12 determines the static current of the cell plate reference voltage generator provided by MOS transistors N12 and P12. If this static current is high, the cell plate reference voltage generator has low output impedance or high drive ability. Alternately, cell plate reference voltage generator has high output impedance or low drive ability, if the static current is low. To limit the stand-by power consumption of the DRAM chip the static current provided by the cell plate reference voltage generator must be kept low.

However, the low static current characteristic of the conventional cell plate reference voltage generator can create a severe problem during memory access. Referring to FIG. 1 and FIG. 2, during memory access all the memory cells connected to selected word-lines are enabled and may be accessed by corresponding bit-lines. That is, the current in the bit-lines may charge or discharge the storage capacitors of the selected memory cells when the corresponding access transistors are turned on as described above. Therefore, current surges flowing into and from the storage capacitors can occur in the period of memory write and read cycles. Voltage noise in the cell plate reference voltage $V_P$ will occur as a result of the cell plate reference voltage generator having less drive ability and not being able to provide adequate current to these storage capacitors.

This induced voltage noise may be lower or higher than the normal level of the cell plate reference voltage $V_P$. It is known that memory cells that are not being access may be disturbed due to noise on their common plates of the cell capacitor $C_C$ that brings the cell plate reference voltage $V_P$ lower than the normal level. For any memory cell not being accessed, the gate of its pass transistor $N_P$ is connected to a grounded word-line, and, therefore, the pass transistor $N_P$ is turned off. Basically, negative voltage noise on the common plate of the cell capacitor can not charge or discharge the cell capacitor $C_C$ as long as the access transistor is kept off. As a result, the voltage on the storage node $D_X$ of the storage capacitor moves down with this noise that lowers the voltage level of the cell plate reference voltage generator for the same amount. Usually, the pass transistors $N_P$ in DRAMS are N-type MOS transistors. If a low voltage or zero voltage is stored in the memory cell not being accessed and the magnitude of the noise that lowers the voltage level of the cell plate reference voltage generator is greater than the threshold voltage $V_{TH}$ of its pass transistor $N_P$, the pass transistor $N_P$ will turn on and introduce current from the connected bit-lines BL0, BL0B, BL1, BL1B to flow through the cell capacitor $C_C$. Thus the memory cell is disturbed by the negative noise that lowers the voltage level of the cell plate reference voltage generator. The sub-threshold current of the pass transistor $N_P$ also increases even though the negative noise that lowers the voltage level of the cell plate reference voltage generator is not sufficient to completely turn on the pass transistor $N_P$.

Two conventional techniques may be used to reduce disturbance effects caused by noise that lowers the voltage level of the cell plate reference voltage generator. The first technique is to implement pass transistors having a high threshold voltage $V_{TH}$ to increase noise margin. However, a pass transistor with a high threshold voltage level $V_{TH}$ will slow down memory access. The alternative is to apply a negative voltage to the unselected word-lines to reverse-bias these pass transistors $N_P$, but that requires extra control circuitry in each decoder and driver connected to the word lines and consequently requires more area and consumes more power.

An example of the effect of the noise present at the cell plate reference voltage generation circuit is shown in FIG. 3. In this example the memory cell CELL 1 of FIG. 1 has a high logic level (1) present on the top plate D1 of the cell capacitor $C_C$ and the memory cell CELL 0 has a low logic level (0) present on the cell capacitor. The voltage level present at the junction D1 of the top plate of the cell capacitor $C_C$ and the drain of the pass transistor $N_P$ of the memory cell CELL 1 is at the voltage level of the power supply voltage source $V_{DD}$. The voltage level present at the junction D0 of the top plate of the cell capacitor $C_C$ and the drain of the pass transistor $N_P$ of the memory cell CELL 0 is at approximately the voltage level of the ground reference point GND. The bit-lines BL0 and BL0B are brought to a voltage level that is approximately one-half the voltage level of the power supply voltage source ($V_{DD}/2$).

The word-line WL0 is brought to a voltage level such that the pass transistor $N_P$ of the memory cell CELL 1 is turned on at time $T_0$ and the charge present on the top plate D1 of the cell capacitor $C_C$ of the memory cell CELL 1 flows to the bit-line BL0. The voltage levels of the top plate D1 of the cell capacitor $C_C$ of the memory cell CELL 1 and the bit-line BL0 become equal.

During the flow of charge from the top plate D1 of the cell capacitor $C_C$ of the memory cell CELL 1, the voltage level of the cell plate reference voltage $V_P$ decreases by the amount $\Delta V_P$. This is a result of the lack of the output butter of FIG. 2 being able to provide sufficient current. Since the top plate D0 of the cell capacitor $C_C$ of memory cell CELL 0 is not selected, its voltage will also decline by the amount $\Delta V_{DD}$.

At the time $T_1$, the sense amplifier enable signal SAE changes from the low logic level (0) to the high logic level (1), thus activating the sense amplifier SA0. The difference between the bit-lines BL0 and BL0B is sensed and amplified and the bit-line BL0 and the top plate D1 of cell capacitor $C_C$ of the memory cell CELL 0 are forced at time $T_2$ to the voltage level of the power supply voltage source $V_{DD}$. At this same time $T_2$, the bit-line BL0B is forced to the voltage level approaching that of the ground reference point GND.

The physical structure of the distribution paths of the bit-lines BL0 and BL0B and the cell plate reference voltage generator $V_P$ cause parasitic capacitances to be present between these distribution paths. Thus, when the sense amplifier enable signal SAE is activated at time $T_1$, the bit-line BL0 is forced to the voltage level of the power supply voltage source $V_{DD}$, and the bit-line BL0B is forced to the voltage level approaching the ground reference point, the voltage level of the cell plate reference voltage generator $V_P$ will again vary.

If, as described above, the voltage present at the top plate D0 of the cell capacitor $C_C$ of the memory cell CELL 0 is sufficiently large, the pass transistor $N_P$ of the memory cell CELL 0 will conduct sufficiently to cause the voltage level at the top plate D0 of the cell capacitor $C_C$ of the memory cell CELL 0 to change by the amount $\Delta V_{DD2}$. This voltage variation $\Delta V_{DD2}$ may be sufficient to cause errors in the digital data retained in the memory.

A third solution to the noise that lowers the voltage level of the cell plate reference voltage generator is described in U.S. Pat. No. 5,734,603 (Tai) as shown in FIG. 4.

The cell plate noise-reducing circuit of Tai includes a sampling circuit, a comparator and a charge device P43. The sampling circuit maintains a sample voltage at node SVP, which is identical to the cell plate reference voltage $V_P$ when there is no memory access in the DRAM. The comparator is a controllable device that receives the sample voltage at node SVP and the noisy cell plate reference voltage $V_P$ and generates a difference voltage at node A corresponding to the cell plate noise. The difference voltage at node A controls charged device P43. When the difference voltage at node A represents the situation of negative noise on the cell plate reference voltage, the charge device P43 provides a temporarily large current to the cell plate reference voltage $V_P$.

The sampling circuit includes capacitor CAP40 and PMOS transistor switch P42. PMOS transistor switch P42 is connected between capacitor CAP40 and the cell plate reference voltage $V_P$ and is controlled by enable signal. The comparator includes PMOS transistors P40 and P41 that provide current mirror loads for differential pair NMOS transistors N40 and N41. NMOS transistor N42 is a controlled transistor that enables or disables comparator. The PMOS transistor P43 is a large-scale transistor that is connected to the power supply voltage source $V_{DD}$ to provide a large current to $V_P$.

Cell plate noise occurs when there is a memory access, and therefore, the cell plate noise is predictable. The enable signal ENABLE is in low logic level (0) if there is no memory access. However, the enable signal ENABLE is in high logic level (1) during memory access. When enable signal ENABLE is in low logic level (0), the comparator is disabled and will not contribute static current in the DRAM. However, enable signal ENABLE turns on PMOS transistor P42, allowing the sample voltage at node SVP to be identical to the cell plate reference voltage $V_P$. When there is memory access, the enable signal ENABLE then switches to the high logic level (1), enabling the comparator while disabling PMOS transistor P42. As a result, the normal level of the cell plate reference voltage $V_P$ is held at node SVP. When cell plate noise lowers the voltage level of the cell plate reference voltage $V_P$ because of the memory access, the noisy cell plate reference voltage $V_P$ is compared with the sample voltage at node SVP. A negative noise in the cell plate reference voltage $V_P$ is amplified in contrast to the sample voltage at node SVP. The amplified negative signal at node A is applied to the gate of PMOS transistor P43 and the PMOS transistor P43 is turned on to provide a large current to the common plates of the cell capacitors $C_C$ for pulling up the voltage at this node. The PMOS transistor P43 provides a negative feedback path for the comparator thus suppressing the noise level at the cell plate reference voltage $V_P$.

U.S. Pat. No. 4,769,784 (Doluca et al.) describes a plate capacitor bias generator. The capacitor-plate bias generator produces a voltage on the common capacitor plate node of the DRAM cell capacitor. The voltage consists of a constant voltage plus the sense-level voltage. Consequently, the capacitor-plate node tracks any variations in the sense-level voltage. The constant voltage is 3 times the bandgap voltage of silicon. The circuit includes a reference-voltage source which produces the sum of the sense-level voltage and the bandgap voltage, and a feedback control circuit for enabling either a charge pump or a charge bleeder to regulate the capacitor-plate voltage at a level above the circuit supply voltage.

U.S. Pat. No. 5,255,232 (Foss et al.) teaches a method for pre-charging a memory cell bit storage capacitor. The storage capacitor reference plate is driven from a high impedance voltage divider, minimizing the effects of voltage supply noise. This prevents the voltage supply noise from coupling to storage capacitor and turning on the associated capacitor access transistor.

SUMMARY OF THE INVENTION

An object of this invention is to provide a circuit that prevents fluctuation in a cell plate biasing reference voltage applied to the commonly connected plates of cell capacitors of an array of memory storage cells of a DRAM.

To accomplish this and other objects, a voltage clamping circuit has a clamp signal terminal for receiving a clamping signal from external circuitry during an access time of the DRAM array that enables the voltage clamping circuit. The voltage clamping circuit further has a clamping circuit for providing additional current to the common plates of the cell capacitors of the DRAM array to maintain the plate bias voltage level at the common plates of the cell plate capacitor of the cell. The voltage clamping circuit is connected to the clamp signal terminal, the plate bias voltage source, a voltage terminal of a power supply voltage source, and a reference terminal or ground of the power supply voltage source.

The clamping circuit has a first current sourcing circuit that is connected to the voltage terminal, the clamp signal terminal, and the plate bias voltage source for providing the additional current to the plate bias voltage source while maintaining plate bias voltage level when the voltage clamping circuit is enabled. Further, the clamping circuit has a second current sourcing circuit that is connected to the reference terminal, the clamp signal terminal, and the plate bias voltage source for providing the additional current to the plate bias voltage source, while maintaining the plate bias voltage level. The first current sourcing circuit provides the additional current in a first or positive direction and the second current sourcing circuit provides the additional current in a second or negative direction.

The first current sourcing circuit includes a first MOS transistor of the first conductivity type having a source connected to the voltage terminal of the power supply voltage source. The first current sourcing circuit also includes a first inverting circuit. The inverting circuit has an input terminal connected to the clamp signal terminal and an output terminal connected to a gate of the first MOS transistor of the first conductivity type and contains an inverted level of the clamping signal.

The first current sourcing circuit further includes a first resistor having a first terminal connected to the drain of the first MOS transistor of the first conductivity type and a second terminal connected to the plate bias voltage source;

Upon receiving the clamping signal, the first MOS transistor of the first conductivity type is turned on and any noise fluctuations of a first type present on the plate bias voltage source are prevented by the additional current.

The second current sourcing circuit has a first MOS transistor of the second conductivity type having a source connected to the reference terminal or ground, and a gate connected to the clamping signal terminal. The second current sourcing circuit has a second resistor having a first terminal connected to the drain of the first MOS transistor of the second conductivity type, and a second terminal connected to the plate bias voltage source.

Upon receiving the clamping signal, the first MOS transistor of the second conductivity type is turned on and any noise fluctuations of a second type present on the plate bias voltage source are prevented by the additional current.

An alternate embodiment of the first current sourcing circuit has a second MOS transistor of the first conductivity type with a source connected to the voltage terminal of the power supply voltage source. The alternate embodiment of the first current sourcing circuit has a second MOS transistor of the second conductivity type. The second MOS transistor of the second conductivity type has a drain connected to a drain of the second MOS transistor of the first conductivity type, and a gate connected to a first voltage sense point within the plate bias voltage source, and a source connected to the plate bias voltage source. The alternate embodiment of the first current sourcing circuit has a second inverting circuit. The second inverting circuit has an input connected to the clamp signal terminal and an output terminal connected to the gate of the second MOS transistor of the first conductivity type. The output terminal contains an inverted level of the clamping signal.

Upon receiving the clamping signal the second MOS transistor of the first conductivity type is turned on and the second MOS transistor of the second conductivity type maintains the plate bias voltage and prevents any noise fluctuations of the first type present on the plate bias voltage source.

An alternate embodiment of the second current sourcing circuit has a third MOS transistor of the second conductivity type. The third MOS transistor of the second conductivity type has a source connected to the reference terminal or ground, and a gate connected to the clamp signal terminal. The alternate embodiment of the second current sourcing circuit has a third MOS transistor of the first conductivity type with its drain connected to the drain of the third MOS transistor of the second conductivity type, and a gate connected to a second voltage sense source within the plate bias voltage source.

Upon receiving the clamping signal the third MOS transistor of the second conductivity type is turned on and the third MOS transistor of the first conductivity type maintains the plate bias voltage and prevents any noise fluctuations of the second type on the plate bias voltage source.

BRIEF DESCRIPTION OF THE DRAWINGS

FIG. 1 is an abbreviated schematic diagram of a DRAM array of the prior art.

FIG. 2 is a schematic diagram of a cell plate reference voltage generation circuit of the prior art.

FIG. 3 is a plot of the voltage at various points within the DRAM array of FIG. 1 employing the cell plate reference voltage generation circuit of FIG. 2 versus time.

FIG. 4 is a schematic diagram of a cell plate reference voltage generation circuit employing a cell plate noise reducing circuit of the prior art.

FIG. 5 is a block diagram of a cell plate reference voltage generation circuit employing the voltage clamping circuit of this invention.

DETAILED DESCRIPTION OF THE INVENTION

It is well known, as explained above, that the fluctuations or noise in the cell plate reference voltage $V_P$ at the commonly connected plates of the cell capacitors $C_C$ of a DRAM array occur only during an access. Therefore, a voltage clamping circuit as shown in FIG. 5 has an input terminal CLAMP for receiving a clamp signal. The clamp signal activates the voltage clamping circuit during an access of the DRAM array and disables the voltage clamping circuit at all other times. The cell plate reference voltage generation circuit provides the cell plate reference voltage $V_P$ to the commonly connected plates of the cell capacitors $C_C$ as described in FIG. 1. It is noted here that the cell plate reference voltage generation circuit is designed to have minimum current providing capability to minimize the static stand-by current of the DRAM array of FIG. 1. When activated, the voltage clamping circuit provides the necessary additional current to augment the cell plate reference voltage generation circuit to prevent excess fluctuations in the cell plate reference voltage during an access of the DRAM array.

Figure 6:
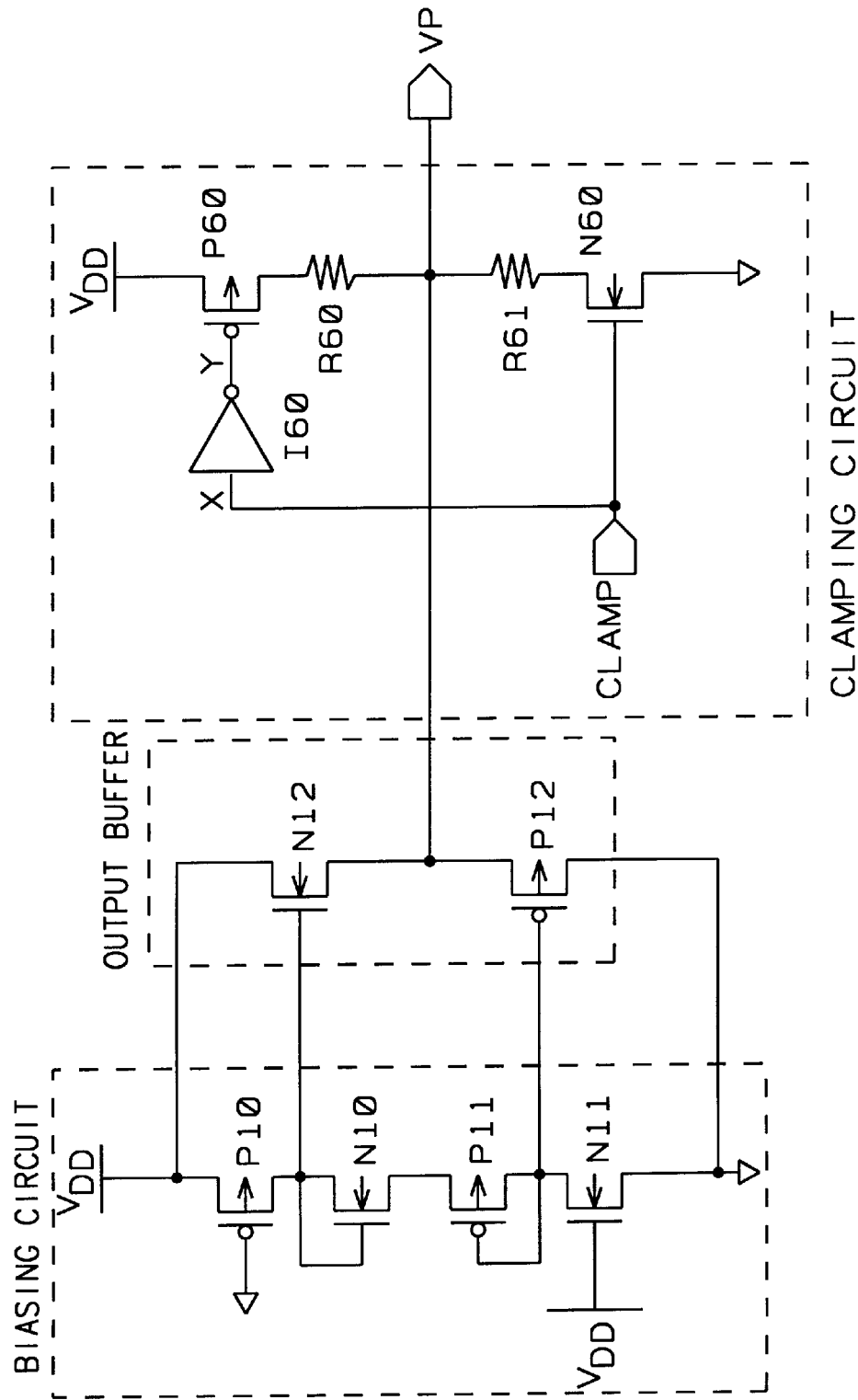
FIG. 6 is a schematic diagram of a cell plate reference voltage generation circuit employing a first embodiment of the voltage clamping circuit of this invention.

FIG. 6 illustrates a first embodiment of the voltage clamping circuit of this invention. The cell plate reference voltage generation circuit has the biasing circuit and the output buffer circuit as described in FIG. 1.

The voltage clamping circuit has the input terminal CLAMP for providing the clamping signal from external timing circuits during an access of the DRAM. The input terminal CLAMP is connected to the input X of the inverter I60 and the gate of the NMOS transistor N60. The output Y of the inverter I60 contains the negative state of the clamping signal and is connected to the gate of the PMOS transistor P60.

The source of the NMOS transistor N60 is connected to the ground reference point GND and the source of the PMOS transistor P60 is connected to the voltage terminal of the power supply voltage source $V_{DD}$. The resistor R61 is connected between the drain of the NMOS transistor N60 and the output terminal $V_P$ of the cell plate reference voltage generation circuit The resistor R60 is connected between the drain of the PMOS transistor P60 and the output terminal $V_P$ of the cell plate reference voltage generation circuit During an access of the DRAM array, the clamping signal is activated. The NMOS transistor N60 and the PMOS transistor P60 are turned on allowing current to flow through the resistors R60 and R61. The resistors R60 and R61 act as a voltage divider and have values of resistance that set the output terminal $V_P$ to the cell plate reference voltage. Further, the values of the resistance of the resistor R60 and R61 are such that any current induced at the cell capacitor $C_C$ being accessed does not cause the cell plate reference voltage to fluctuate excessively. At the completion of the access of the DRAM array the clamping signal is deactivated, thus turning off the NMOS transistor N60 and the PMOS transistor P60. The cell plate reference voltage generation circuit reassumes control of the cell plate reference voltage at the output terminal $V_P$.

Figure 7:
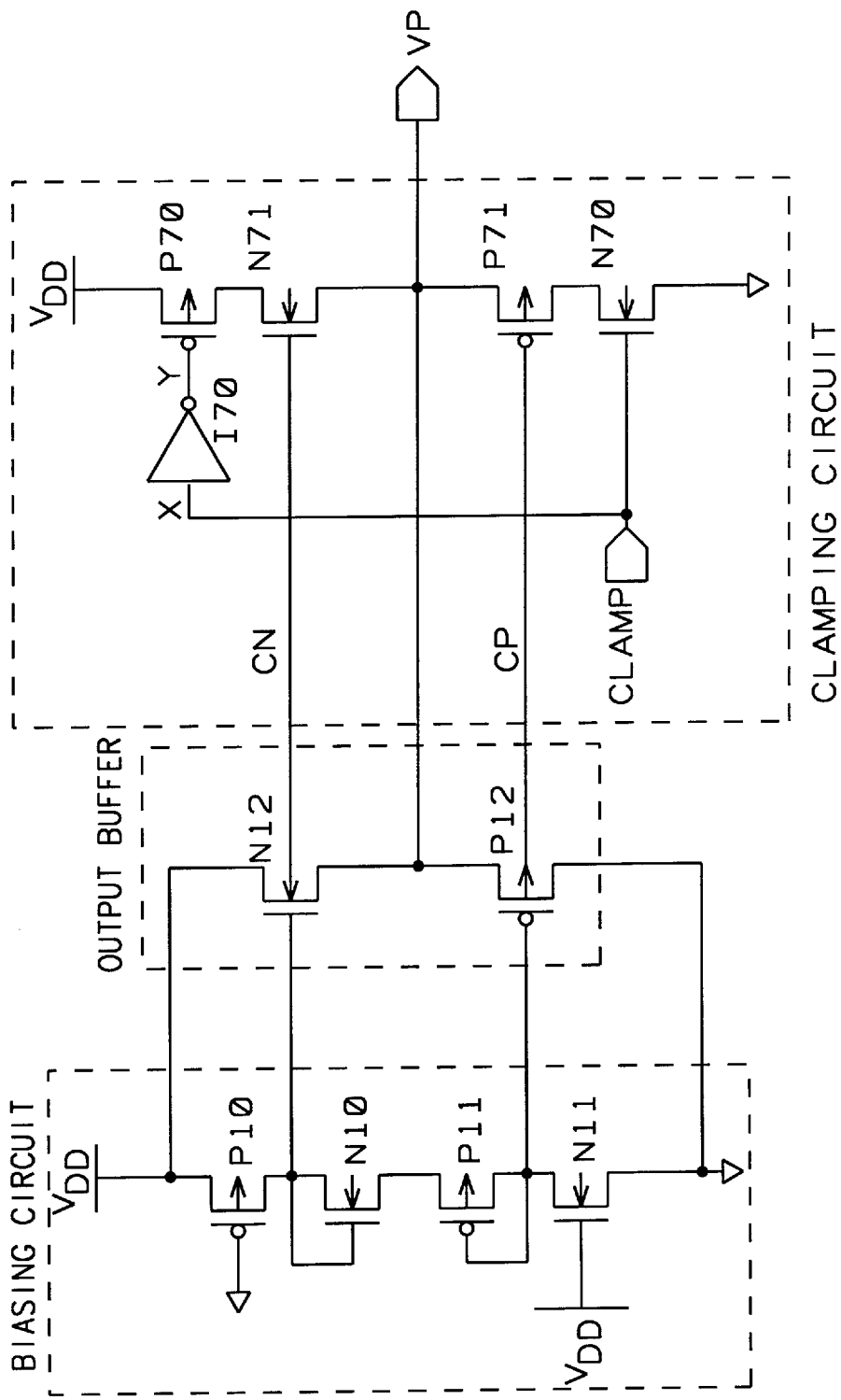
FIG. 7 is a schematic diagram of a cell plate reference voltage generation circuit employing a second embodiment of the voltage clamping circuit of this invention.

For a discussion of a second embodiment of the voltage clamping circuit of this invention, refer now to FIG. 7. As described before in FIG. 1, the cell plate reference voltage generation circuit has the biasing circuit and the output buffer circuit connected between the power supply voltage source $V_{DD}$ and the ground reference point GND to derive the cell plate reference voltage at the output terminal $V_P$.

The second embodiment of the voltage clamping circuit of this invention has an input terminal CLAMP to receive the clamping signal as described above. The input X of the inverter I70 and the gate of the NMOS transistor N70 are connected to the input terminal CLAMP. The source of the NMOS transistor N70 is connected to the ground reference point GND.

The output Y of the inverter I70 contains the negative state of the clamping signal and is connected to the gate of the PMOS transistor P70. The source of the PMOS transistor P70 is connected to the voltage terminal of the power supply voltage source $V_{DD}$. The drain of the PMOS transistor P70 is connected to the drain of the NMOS transistor N71. The source of the NMOS transistor N71 is connected to the output terminal $V_P$ of the cell plate reference voltage generation circuit.

The drain of the NMOS transistor N70 is connected to the drain of the PMOS transistor P71 and the source of the PMOS transistor P71 is connected to the output terminal $V_P$ of the cell plate reference voltage generation circuit.

The gate of the NMOS transistor N71 is connected to the voltage sense point CN. The voltage sense point CN is the junction of the commonly connected gate and drain of the NMOS transistor N10 and the gate of the NMOS transistor N12 of the cell plate reference voltage generation circuit. The gate of the PMOS transistor P71 is connected to the voltage sense point $C_P$. The voltage sense point $C_C$ is the junction of the commonly connected gate and drain of the PMOS transistor P11 and the gate of the PMOS transistor P12 of the cell plate reference voltage generation circuit.

During an access of the DRAM array as described in FIG. 1, the clamping signal is active. The NMOS transistor N70 and the PMOS transistor P70 are turned on The NMOS transistor N71 and the PMOS transistor P71 act together as a buffer circuit to provide additional current necessary maintain the cell plate reference voltage at its designed level, thus preventing fluctuations of the voltage level of the cell plate reference voltage. The PMOS transistors P70 and P71 and the NMOS transistors N70 and N71 are relatively large in size as compared with the NMOS transistor N12 and the PMOS transistor P12. The current available at the output terminal $V_P$ of the cell plate reference voltage generation circuit is dependent on the ratio of the sizes of the NMOS transistor N10 and the PMOS transistor P11, and the NMOS transistor N12 and the PMOS transistor P12, as well as the NMOS transistor N71 and the PMOS transistor P71. This relatively large size of the NMOS transistor N71 and the PMOS transistor P71 increases the static current of the cell plate reference voltage generation circuit and decreases the output impedance of the cell plate reference voltage generation circuit The lower impedance increases the drive capability or allows additional current to be available such that the cell plate reference voltage fluctuations are minimized.

Figure 8:
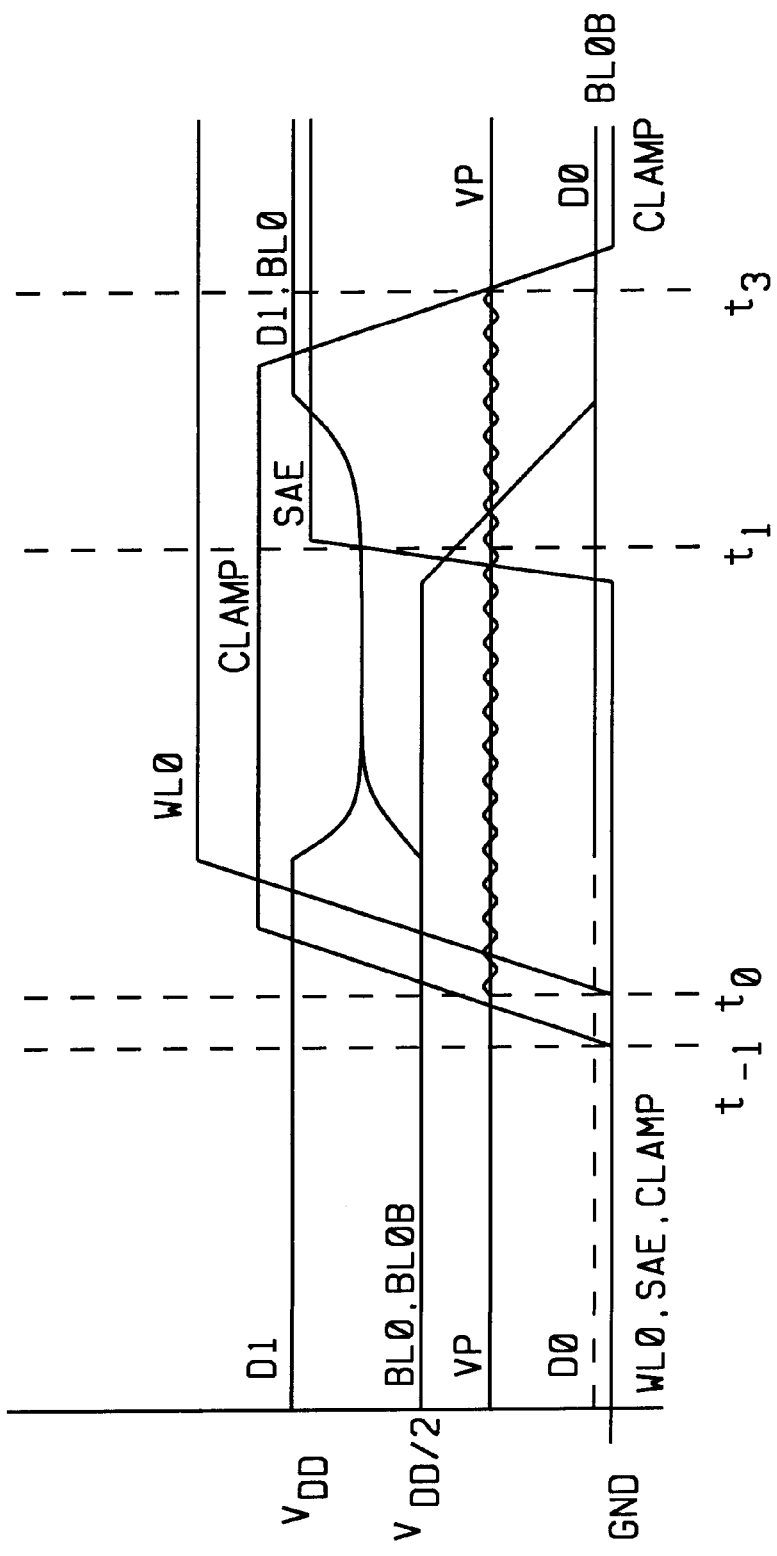
FIG. 8 is a plot of the voltage at various points within the DRAM array of FIG. 1 employing a cell plate reference voltage generation circuit incorporating the voltage clamping circuit of this invention.

FIG. 8 illustrates the voltage waveforms of various points within a DRAM array incorporating the cell plate reference voltage generation circuit with the voltage clamping circuit of this invention. As with the example of FIG. 3, prior to accessing the memory cell CELL 1 of FIG. 1, a high level ($V_{DD}$) is stored at the top plate D1 of the cell capacitor $C_C$ of the memory cell CELL 1 and a low level (GND) is stored at the top plate D0 of cell capacitor $C_C$ of the memory cell CELL 0. The bit-lines BL0 and BL0B are pre-charged to a voltage that is one-half the voltage level of the power supply voltage source ($V_{DD}/2$). At the time $T_1$, the clamping signal is activated, thus providing the additional drive capability from the clamping circuit of this invention to maintain the cell plate reference voltage $V_P$ at its designed level. At the time $T_0$, the word-line WL0 is brought from a low level (GND) to a voltage level sufficient to turn on the pass transistor $N_P$ of the memory cell CELL 1. The charge flows from the top plate D1 of the cell capacitor $C_C$ of the memory cell CELL 1 to the bit-line BL0. The voltage level of the top plate D1 of the cell capacitor $C_C$ of the memory cell CELL 1 and the bit-line BL0 become equal. It should be noted that any change in the voltage at the common plate of the cell capacitor $C_C$ of the memory cell CELL 1 is prevented by the additional current available from the voltage clamping circuit of this invention, thus the cell plate reference voltage $V_P$ remains constant as does the voltage level of the top plate D0 of the cell capacitor $C_C$ of the memory cell CELL 0.

At the time $T_2$, the sense amplifier enable SAE is brought from a low level (GND) to a high level ($V_{DD}$), thus activating the sense amplifier SA0 of FIG. 1. The voltage difference present between the bit-lines BL0 and BL0B are sensed and amplified and forced to the appropriate levels (BL=$V_{DD}$, BL0B=GND). Again, any voltage fluctuations of the cell plate reference voltage $V_P$ induced from the bit-lines BL0 and BL0B as a result of parasitic capacitances are prevented by the voltage clamping circuit of this invention.

Upon completion of the access of the DRAM array at $T_3$, the clamping signal deactivates the voltage clamping circuit of this invention and the cell plate reference voltage generation circuit reassumes control with low static current and high impedance.

While this invention has been particularly shown and described with reference to the preferred embodiments thereof, it will be understood by those skilled in the art that various changes in form and details may be made without departing from the spirit and scope of the invention.

The invention claimed is:

1. A voltage clamping circuit for preventing noise fluctuations in a plate bias voltage level on a plate bias voltage source coupled to commonly connected plates of cell capacitors within a DRAM array, comprising:

a clamp signal terminal for receiving a clamping signal from external circuitry during an access time of said DRAM array that enables said voltage clamping circuit; and a clamping means for providing additional current to the common plates of the cell capacitors of the DRAM array to maintain the plate bias voltage level at the common plates of the cell connected to the clamp signal terminal, the plate bias voltage source, a voltage terminal of a power supply voltage source, and a reference terminal of said power supply voltage source, whereby said clamping means comprises:

a first current sourcing means connected to the voltage terminal, the clamp signal terminal, and the plate bias voltage source for providing the additional current to the plate bias voltage source while maintaining plate bias voltage level and preventing any noise fluctuations of a first type present on the plate bias voltage source when the voltage clamping circuit is enabled, and a second current sourcing means connected to the reference terminal, the clamp signal terminal, and the plate bias voltage source for providing the additional current to the plate bias voltage source, while maintaining the plate bias voltage level and preventing any noise fluctuations of a first type present on the plate bias voltage source when the voltage clamping circuit is enabled.

2. The voltage clamping circuit of claim 1 wherein the first current sourcing means is comprising:

a first MOS transistor of the first conductivity type having a source connected to the voltage terminal;

a first inverting circuit having an input terminal connected to the clamp signal terminal and an output terminal connected to a gate of the first MOS transistor of the first conductivity type, whereby said output terminal contains an inverted level of the clamping signal; and a first resistor having a first terminal connected to the drain of the first MOS transistor of the first conductivity type and a second terminal connected to the plate bias voltage source;

whereby, upon receiving said clamping signal, the first MOS transistor of the first conductivity type is turned on and said noise fluctuations of a first type present on the plate bias voltage source are prevented.

3. The voltage clamping circuit of claim 1 wherein the second current sourcing means is comprising:

a first MOS transistor of the second conductivity type having a source connected to the reference terminal, and a gate connected to the clamping signal terminal; and a second resistor having a first terminal connected to the drain of the first MOS transistor of the second conductivity type, and a second terminal connected to the plate bias voltage source;

whereby, upon receiving said clamping signal, the first MOS transistor of the second conductivity type is turned on and said noise fluctuations of a second type present on the plate bias voltage source are prevented.

4. The voltage clamping circuit of claim 1 wherein the first current sourcing means is comprising:

a second MOS transistor of the first conductivity type having a source connected to the voltage terminal;

a second MOS transistor of the second conductivity type having a drain connected to a drain of the second MOS transistor of the first conductivity type, and a gate connected to a first voltage sense point within said plate bias voltage source, and a source connected to the plate bias voltage source;

a second inverting circuit having an input connected to the clamp signal terminal and an output terminal connected to the gate of the second MOS transistor of the first conductivity type, whereby said output terminal contains an inverted level of the clamping signal;

whereby, upon receiving said clamping signal said second MOS transistor of the first conductivity type is turned on and the second MOS transistor of the second conductivity type maintains the plate bias voltage and prevents said noise fluctuations of the first type present on the plate bias voltage source.

5. The voltage clamping circuit of claim 1 wherein the second current sourcing means is comprising:

a third MOS transistor of the second conductivity type having a source connected to the reference terminal, and a gate connected to the clamp signal terminal;

a third MOS transistor of the first conductivity type having a drain connected to a drain of the third MOS transistor of the second conductivity type, and a gate connect ed to a second voltage sense source within said plate bias voltage source;

whereby, upon receiving said clamping signal said third MOS transistor of the second conductivity type is turned on and the third MOS transistor of the first conductivity type maintains the plate bias voltage and prevents said noise fluctuations of the second type on the plate bias voltage source.

6. A plate bias voltage generating circuit that is immune to noise fluctuations in a plate bias voltage level coupled to common plates of cell capacitors with a DRAM array comprising:

a plate bias voltage terminal to couple the plate bias voltage level to the common plates of the cell capacitors;

a plate bias voltage source connected between a voltage terminal and a reference terminal of a power supply voltage source to derive said plate bias voltage level from said power supply voltage source, and connected to the plate bias voltage terminal for transferring said plate bias voltage level to said common plates;

a voltage clamping circuit connected between the voltage terminal and the reference terminal and to the plate bias voltage terminal comprising:

a clamp signal terminal for receiving a clamping signal from external circuitry during an access time of said DRAM array that enables said voltage clamping circuit; and a clamping means for providing additional current to the common plates of the cell capacitors of the DRAM array to maintain the plate bias voltage level at the common plates of the cell connected to the clamp signal terminal, the plate bias voltage source, a voltage terminal of a power supply voltage source, and a reference terminal of said power supply voltage source, whereby said clamping means comprises:

a first current sourcing means connected to the voltage terminal, the clamp signal terminal, and the plate bias voltage source for providing the additional current to the plate bias voltage source while maintaining plate bias voltage level and preventing any noise fluctuations of a first type present on the plate bias voltage source when the voltage clamping circuit is enabled, and a second current sourcing means connected to the reference terminal, the clamp signal terminal, and the plate bias voltage source for providing the additional current to the plate bias voltage source, while maintaining the plate bias voltage level and preventing any noise fluctuations of a first type present on the plate bias voltage source when the voltage clamping circuit is enabled.

7. The plate bias voltage generating circuit of claim 6 wherein the first current sourcing means is comprising:

a first MOS transistor of the first conductivity type having a source connected to the voltage terminal;

a first inverting circuit having an input terminal connected to the clamp signal terminal and an output terminal connected to a gate of the first MOS transistor of the first conductivity type, whereby said output terminal contains an inverted level of the clamping signal; and a first resistor having a first terminal connected to the drain of the first MOS transistor of the first conductivity type and a second terminal connected to the plate bias voltage source;

whereby, upon receiving said clamping signal, the first MOS transistor of the first conductivity type is turned on and said noise fluctuations of a first type present on the plate bias voltage source are prevented.

8. The plate bias voltage generating circuit of claim 6 wherein the second current sourcing means is comprising:

a first MOS transistor of the second conductivity type having a source connected to the reference terminal, and a gate connected to the clamping signal terminal; and a second resistor having a first terminal connected to the drain of the first MOS transistor of the second conductivity type, and a second terminal connected to the plate bias voltage source;

whereby, upon receiving said clamping signal, the first MOS transistor of the second conductivity type is turned on and said noise fluctuations of a second type present on the plate bias voltage source are prevented.

9. The plate bias voltage generating circuit of claim 6 wherein the first current sourcing means is comprising:

a second MOS transistor of the first conductivity type having a source connected to the voltage terminal;

a second MOS transistor of the second conductivity type having a drain connected to a drain of the second MOS transistor of the first conductivity type, and a gate connected to a first voltage sense point within said plate bias voltage source, and a source connected to the plate bias voltage source; and a second inverting circuit having an input connected to the clamp signal terminal and an output terminal connected to the gate of the second MOS transistor of the first conductivity type, whereby said output terminal contains an inverted level of the clamping signal;

whereby, upon receiving said clamping signal said second MOS transistor of the first conductivity type is turned on and the second MOS transistor of the second conductivity type maintains the plate bias voltage and prevents said noise fluctuations of the first type present on the plate bias voltage source.

10. The plate bias voltage generating circuit of claim 6 wherein the second current sourcing means is comprising:

a third MOS transistor of the second conductivity type having a source connected to the reference terminal, and a gate connected to the clamp signal terminal; and a third MOS transistor of the first conductivity type having a drain connected to a drain of the third MOS transistor of the second conductivity type, and a gate connected to a second voltage sense source within said plate bias voltage source;

whereby upon receiving said clamping signal said third MOS transistor of the second conductivity type is turned on and the third MOS transistor of the first conductivity type maintains the plate bias voltage and prevents said noise fluctuations of the second type on the plate bias voltage source.

11. A DRAM comprising:

a voltage clamping circuit for preventing noise fluctuations in a plate bias voltage level on a plate bias voltage source coupled to commonly connected plates of cell capacitors within a DRAM array, comprising:

a clamp signal terminal for receiving a clamping signal from external circuitry during an access time of said DRAM array that enables said voltage clamping circuit; and a clamping means for providing additional current to the common plates of the cell capacitors of the DRAM array to maintain the plate bias voltage level at the common plates of the cell connected to the clamp signal terminal, the plate bias voltage source, a voltage terminal of a power supply voltage source, and a reference terminal of said power supply voltage source, whereby said clamping means comprises:

a first current sourcing means connected to the voltage terminal, the clamp signal terminal, and the plate bias voltage source for providing the additional current to the plate bias voltage source while maintaining plate bias voltage level and preventing any noise fluctuations of a first type present on the plate bias voltage source when the voltage clamping circuit is enabled, and a second current sourcing means connected to the reference terminal, the clamp signal terminal, and the plate bias voltage source for providing the additional current to the plate bias voltage source, while maintaining the plate bias voltage level and preventing any noise fluctuations of a first type present on the plate bias voltage source when the voltage clamping circuit is enabled.

12. The DRAM of claim 11 wherein the clamping means is comprising:

a first MOS transistor of the first conductivity type having a source connected to the voltage terminal;

a first inverting circuit having an input terminal connected to the clamp signal terminal and an output terminal connected to a gate of the first MOS transistor of the first conductivity type, whereby said output terminal contains an inverted level of the clamping signal; and a first resistor having a first terminal connected to the drain of the first MOS transistor of the first conductivity type and a second terminal connected to the plate bias voltage source;

whereby upon receiving said clamping signal, the first MOS transistor of the first conductivity type is turned on and said noise fluctuations of a first type present on the plate bias voltage source are prevented.

13. The DRAM of claim 11 wherein the first current sourcing means is comprising:

a first MOS transistor of the second conductivity type having a source connected to the reference terminal, and a gate connected to the clamping signal terminal; and a second resistor having a first terminal connected to the drain of the first MOS transistor of the second conductivity type, and a second terminal connected to the plate bias voltage source;

whereby upon receiving said clamping signal, the first MOS transistor of the second conductivity type is turned on and said noise fluctuations of a second type present on the plate bias voltage source are prevented.

14. The DRAM of claim 11 wherein the first current sourcing means is comprising:

a second MOS transistor of the first conductivity type having a source connected to the voltage terminal;

a second MOS transistor of the second conductivity type having a drain connected to a drain of the second MOS transistor of the first conductivity type, and a gate connected to a first voltage sense point within said plate bias voltage source, and a source connected to the plate bias voltage source; and a second inverting circuit having an input connected to the clamp signal terminal and an output terminal connected to the gate of the second MOS transistor of the first conductivity type, whereby said output terminal contains an inverted level of the clamping signal;

whereby upon receiving said clamping signal said second MOS transistor of the first conductivity type is turned on and the second MOS transistor of the second conductivity type maintains the plate bias voltage and prevents said noise fluctuations of the first type present on the plate bias voltage source.

15. The DRAM of claim 11 wherein the second current sourcing means is comprising:

a third MOS transistor of the second conductivity type having a source connected to the reference terminal, and a gate connected to the clamp signal terminal; and a third MOS transistor of the first conductivity type having a drain connected to a drain of the third MOS transistor of the second conductivity type, and a gate connected to a second voltage sense source within said plate bias voltage source;

whereby upon receiving said clamping signal said third MOS transistor of the second conductivity type is turned on and the third MOS transistor of the first conductivity type maintains the plate bias voltage and prevents said noise fluctuations of the second type on the plate bias voltage source.

16. A voltage clamping circuit for preventing noise fluctuations in a plate bias voltage level on a plate bias voltage source coupled to commonly connected plates of cell capacitors within a DRAM array, comprising:

a clamp signal terminal for receiving a clamping signal from external circuitry during an access time of said DRAM array that enables said voltage clamping circuit; and a clamping means for providing additional current to the common plates of the cell capacitors of the connected to the clamp signal terminal, the plate bias voltage source, a voltage terminal of a power supply voltage source, and a reference terminal of DRAM array to maintain the plate bias voltage level at the common plates of the cell said power supply voltage source;

whereby said clamping means is comprising:

a first current sourcing means connected to the voltage terminal, the clamp signal terminal, and the plate bias voltage source for providing the additional current to the plate bias voltage source while maintaining plate bias voltage level and preventing any noise fluctuations of a first type present on the late bias voltage source when the voltage camping circuit is enabled when the voltage clamping circuit is enabled; and a second current sourcing means connected to the reference terminal, the clamp signal terminal, and the plate bias voltage source for providing the additional current to the plate bias voltage source, while maintaining the plate bias voltage level and preventing any noise fluctuations of a first type present on the plate bias voltage source when the voltage clamping circuit is enabled.

17. The voltage clamping circuit of claim 16 wherein the first current sourcing means is comprising:

a first MOS transistor of the first conductivity type having a source connected to the voltage terminal;

a first inverting circuit having an input terminal connected to the clamp signal terminal and an output terminal connected to a gate of the first MOS transistor of the first conductivity type, whereby said output terminal contains an inverted level of the clamping signal; and a first resistor having a first terminal connected to the drain of the first MOS transistor of the first conductivity type and a second terminal connected to the plate bias voltage source;

whereby upon receiving said clamping signal, the first MOS transistor of the first conductivity type is turned on and said noise fluctuations of a first type present on the plate bias voltage source are prevented.

18. The voltage clamping circuit of claim 17 wherein the second current sourcing means is comprising:

a first MOS transistor of the second conductivity type having a source connected to the reference terminal, and a gate connected to the clamping signal terminal; and a second resistor having a first terminal connected to the drain of the first MOS transistor of the second conductivity type, and a second terminal connected to the plate bias voltage source;

whereby upon receiving said clamping signal, the first MOS transistor of the second conductivity type is turned on and said noise fluctuations of a second type present on the plate bias voltage source are prevented.

19. The voltage clamping circuit of claim 16 wherein the first current sourcing means is comprising:

a second MOS transistor of the first conductivity type having a source connected to the voltage terminal;

a second MOS transistor of the second conductivity type having a drain connected to a drain of the second MOS transistor of the first conductivity type, and a gate connected to a first voltage sense point within said plate bias voltage source, and a source connected to the plate bias voltage source;

a second inverting circuit having an input connected to the clamp signal terminal and an output terminal connected to the gate of the second MOS transistor of the first conductivity type, whereby said output terminal contains an inverted level of the clamping signal;

whereby upon receiving said clamping signal said second MOS transistor of the first conductivity type is turned on and the second MOS transistor of the second conductivity type maintains the plate bias voltage and prevents said noise fluctuations of the first type present on the plate bias voltage source.

20. The voltage clamping circuit of claim 19 herein the second current sourcing means is comprising:

a third MOS transistor of the second conductivity type having a source connected to the reference terminal, and a gate connected to the clamp signal terminal;

a third MOS transistor of the first conductivity type having a drain connected to a drain of the third MOS transistor of the second conductivity type, and a gate connected to a second voltage sense source within said plate bias voltage source;

whereby upon receiving said clamping signal said third MOS transistor of the second conductivity type is turned on and the third MOS transistor of the first conductivity type maintains the plate bias voltage and prevents said noise fluctuations of the second type on the plate bias voltage source.

\* \* \* \* \*